United States Patent
Enzmann et al.

(10) Patent No.: US 10,033,158 B1
(45) Date of Patent: Jul. 24, 2018

(54) SEMICONDUCTOR LASER, LASER ASSEMBLY AND METHOD OF MAKING A SEMICONDUCTOR LASER

(71) Applicant: OSRAM Opto Semiconductors GmbH, Regensburg (DE)

(72) Inventors: Roland Enzmann, Regensburg (DE); Hubert Halbritter, Dietfurt (DE); Martin Rudolf Behringer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/845,983

(22) Filed: Dec. 18, 2017

(30) Foreign Application Priority Data

Dec. 19, 2016 (DE) .................... 10 2016 124 818

(51) Int. Cl.
| | |
|---|---|
| *H01S 5/125* | (2006.01) |
| *H01S 5/183* | (2006.01) |
| *H01S 5/187* | (2006.01) |
| *H01S 5/18* | (2006.01) |
| *H01S 5/40* | (2006.01) |

(Continued)

(52) U.S. Cl.
CPC ........ *H01S 5/18375* (2013.01); *H01S 5/0217* (2013.01); *H01S 5/0226* (2013.01); *H01S 5/187* (2013.01); *H01S 5/4087* (2013.01)

(58) Field of Classification Search
CPC .. H01S 5/18375; H01S 5/0226; H01S 5/0217; H01S 5/187
USPC ..................................... 372/44.01
See application file for complete search history.

(56) References Cited

U.S. PATENT DOCUMENTS

| 6,829,283 B2 | 12/2004 | Ebeling |
| 7,170,917 B2 | 1/2007 | Amann et al. |
| 8,331,412 B2 | 12/2012 | Amann et al. |

(Continued)

FOREIGN PATENT DOCUMENTS

| DE | 10107349 A1 | 8/2002 |
| DE | 10147353 A1 | 4/2003 |
| EP | 1531466 B1 | 1/2009 |

OTHER PUBLICATIONS

Hecht, J., "Photonic Frontiers: VCSELS: Vertical cavity lasers reach higher speeds and powers," LaserFocusWorld, Jun. 1, 2011, pp. 1-6.

*Primary Examiner* — Tuan Nguyen
(74) *Attorney, Agent, or Firm* — Slater Matsil, LLP

(57) ABSTRACT

A semiconductor laser, a laser assembly and a method of making a semiconductor laser are disclosed. In an embodiment the surface-emitting semiconductor laser includes a carrier having a carrier main side mechanically carrying a semiconductor laser; a first Bragg mirror and a second Bragg mirror so that the second Bragg mirror is further away from the carrier than the first Bragg mirror; a semiconductor layer sequence between the first and the second Bragg mirrors having at least one active zone for generating laser radiation; a metal mirror arranged directly on a side of the first Bragg mirror facing the carrier for reflecting laser radiation generated during operation of the semiconductor laser; a bonding agent layer located between the carrier and the semiconductor layer sequence; a resonator oriented perpendicular to the carrier main side; and an electrically insulating passivation layer located in the metal mirror.

19 Claims, 8 Drawing Sheets

(51) Int. Cl.
*H01S 5/02* (2006.01)
*H01S 5/022* (2006.01)

(56) References Cited

U.S. PATENT DOCUMENTS

| | | | |
|---|---|---|---|
| 2006/0078029 A1 | 4/2006 | Amann | |
| 2007/0258501 A1* | 11/2007 | Chirovsky | B82Y 20/00 |
| | | | 372/50.11 |
| 2016/0020582 A1* | 1/2016 | Ma | H01S 5/187 |
| | | | 372/50.11 |

* cited by examiner

SEMICONDUCTOR LASER, LASER ASSEMBLY AND METHOD OF MAKING A SEMICONDUCTOR LASER

This patent application claims the priority of German patent application 10 2016 124 818.5, filed Dec. 19, 2016, which is incorporated herein by reference in its entirety.

TECHNICAL FIELD

The invention relates to a semiconductor laser. The invention further relates to a laser arrangement. The invention further relates to a method for producing a semiconductor laser.

SUMMARY OF THE INVENTION

Embodiments provide a semiconductor laser that is efficient and can be produced effectively.

According to at least one embodiment, the semiconductor laser is a laser having a vertical cavity or resonator which emits at a surface. Such semiconductor lasers are also referred to as VCSEL, vertical cavity surface emitting lasers.

According to at least one embodiment, the semiconductor laser comprises a carrier. The carrier has a carrier main side. The carrier main side is preferably flat.

According to at least one embodiment, the carrier is that component of the semiconductor laser which mechanically carries and supports the latter. In other words, the semiconductor laser does not represent a mechanically self-supporting, stable unit without the carrier. In particular, a contribution of all other components of the semiconductor laser which are present beside the carrier to a mechanical stability can be negligible or subordinate.

According to at least one embodiment, the semiconductor laser comprises a first Bragg mirror and a second Bragg mirror. In this case, the second Bragg mirror is further away from the carrier than the first Bragg mirror. The Bragg mirrors each comprise alternating layers having a high and low refractive index. As a result of the refractive index jumps between adjacent layers, a high reflectivity is achieved by means of interference effects.

According to at least one embodiment, the semiconductor laser has a semiconductor layer sequence. The semiconductor layer sequence comprises one or more active zones for generating laser radiation. If a plurality of active zones are present, all the active zones are preferably set up to generate laser radiation of the same wavelength. In the case of a plurality of active zones, these are also preferably electrically connected in series and can thus be electrically controlled only jointly. The generation of the laser radiation in the at least one active zone is based on electroluminescence.

According to at least one embodiment, the semiconductor layer sequence is located between the first and the second Bragg mirror. The Bragg mirrors thus represent at least a part of resonator mirrors for the semiconductor laser and the at least one active zone as a laser-active medium.

According to at least one embodiment, the semiconductor laser comprises a bonding agent layer. The bonding agent layer is located between the carrier and the semiconductor layer sequence, preferably directly on the carrier. The semiconductor layer sequence is firmly and permanently connected to the carrier via the bonding agent layer, so that the semiconductor layer sequence does not become detached from the carrier when the semiconductor laser is used as intended.

According to at least one embodiment, the bonding agent layer is composed of a different material system than the carrier and the semiconductor layer sequence. For example, the bonding agent layer is a metallic layer. In this case, the carrier is not formed from the same metal or from the same metal alloy. Furthermore, it is possible for the bonding agent layer to be a layer made of an organic material such as an adhesive. The bonding agent layer can likewise be made of an amorphous material such as glass and/or ceramic. The bonding agent layer is preferably not a layer composed of a semiconductor material and/or an epitaxially grown layer.

According to at least one embodiment, the carrier is different from a growth substrate of the semiconductor layer sequence. In other words, the semiconductor laser has no growth substrate for the semiconductor layer sequence. The growth substrate has been removed in the course of the production process of the semiconductor laser.

According to at least one embodiment, a resonator of the semiconductor laser is oriented perpendicular to the carrier main side. Here and in the following, the term perpendicular is valid in particular with a tolerance of at most 15° or 7.5° or 2°. The direction "perpendicular to the carrier main side" can also be referred to as the vertical direction. The resonator of the semiconductor laser can also be referred to as a cavity, which is formed in particular by the two Bragg mirrors together with the region of the semiconductor layer sequence lying there between. In the resonator, a beam direction is oriented perpendicular to the carrier main side. It is possible for a length of the resonator to be smaller than an average diameter of the resonator, in a plan view of the semiconductor layer sequence.

In at least one embodiment, the semiconductor laser comprises a carrier having a carrier main side which mechanically carries the semiconductor laser. A second Bragg mirror is further away from the carrier than a first Bragg mirror. A semiconductor layer sequence having at least one active zone for generating laser radiation is located between the first and the second Bragg mirror. A bonding agent layer connects the carrier and the semiconductor layer sequence to one another and is located there between. The bonding agent layer is composed of a different material system than the carrier and the semiconductor layer sequence. The carrier is different from a growth substrate of the semiconductor layer sequence, so that the semiconductor laser is free of a growth substrate. A resonator of the semiconductor laser is oriented perpendicular to the carrier main side.

Conventional surface-emitting semiconductor lasers contain a growth substrate for a semiconductor layer sequence. Such a growth substrate is, for example, a GaAs substrate. For cost reasons, the growth substrate is not removed.

In the surface-emitting semiconductor laser described here, the semiconductor layer sequence with the laser structure is flanged onto the carrier in the course of the production process, and the growth substrate is removed. This allows for better heat dissipation than in conventional semiconductor lasers. In addition, this allows the use of dielectric mirrors on one or on both sides of the semiconductor layer sequence, which entails further advantages with regard to heat dissipation and efficiency of the semiconductor laser. Furthermore, during production costs can be saved by using dielectric mirrors instead of mirrors based on semiconductor materials. In particular, it is possible to reduce a number of layer pairs of the Bragg mirrors by combining them with a metal mirror. Further, the semiconductor laser described here can be intensity-modulated more rapidly since a smaller resonator is possible. In addition, the semiconductor layer sequence can be made thinner. A higher power rate, also referred to as yield, can be achieved, for example, by means of a wider stop band.

According to at least one embodiment, at least one, in particular exactly one, of the Bragg mirrors is designed to be electrically insulating. Said Bragg mirror is then a dielectric mirror. In particular, the Bragg mirror in this case consists of dielectric materials, for example, is made of silicon dioxide as a low-refractive material and titanium dioxide as a high-refractive material. The electrically insulating Bragg mirror is preferably the second Bragg mirror, which is located on a side of the semiconductor layer sequence facing away from the carrier.

The first Bragg mirror between the semiconductor layer sequence and the carrier can be based on semiconductor materials having different refractive indices, which are arranged in alternating layers. It is possible for the first Bragg mirror and/or the second Bragg mirror to be made of doped or undoped semiconductor materials. The electrical conductivity of the respective Bragg mirror can be determined by means of the doping. The Bragg mirror in question can thus be set from electrically conductive to electrically insulating.

According to at least one embodiment, the semiconductor layer sequence is based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, the following applies to at least one layer or to all layers of the semiconductor layer sequence: $0 < n \leq 0.8$, $0.4 \leq m < 1$ and $n+m \leq 0.95$ as well as $0 < k \leq 0.5$. However, the semiconductor layer sequence can have dopants and additional components. For the sake of simplicity, however, only the essential components of the crystal lattice of the semiconductor layer sequence are mentioned, that is Al, As, Ga, In, N or P, even if these can be partially replaced and/or supplemented by small quantities of further substances. Preferably, the semiconductor laser is based on the material system AlInGaAs, so that the laser radiation is near-infrared radiation, for example, with a wavelength of a maximum intensity of at least 780 nm and/or at most 1080 nm.

According to at least one embodiment, both the first and the second Bragg mirrors are electrically insulating mirrors, that is to say dielectric mirrors.

According to at least one embodiment, at least one of the Bragg mirrors or both Bragg mirrors, preferably precisely one of the Bragg mirrors, is/are an epitaxially grown mirror and/or a mirror made of semiconductor materials, in particular of doped semiconductor materials. Preferably, said Bragg mirror(s) is/are electrically conductive, specifically in the direction parallel to the growth direction of the semiconductor layer sequence. The Bragg mirror made of semiconductor materials is preferably the first Bragg mirror. The Bragg mirror made of semiconductor materials is particularly preferably combined with a metal mirror, so that a so-called metal-semiconductor hybrid Bragg mirror results.

According to at least one embodiment, the second Bragg mirror forms a light exit window of the semiconductor laser. In other words, an outer surface of the semiconductor laser can be formed by the second Bragg mirror, through which the laser radiation leaves the semiconductor laser. As a result, a separate light exit window, for example, an antireflection coating, can be saved. As a result of the design of the second Bragg mirror, a portion of the laser radiation which is coupled out can be precisely adjusted.

According to at least one embodiment, a current conducting layer is located between at least one of the Bragg mirrors and the semiconductor layer sequence. The current conducting layer is designed for current conduction in the direction parallel to the carrier main side, wherein the current conducting layer is for lateral current spreading. The current conducting layer preferably directly adjoins the semiconductor layer sequence and/or the associated Bragg mirror. In particular, the current conducting layer is located between the semiconductor layer sequence and the first Bragg mirror.

According to at least one embodiment, the current conducting layer is made of a transparent and electrically conductive material. For example, the current conducting layer consists of a transparent conductive oxide such as indium tin oxide, ITO for short, or a maybe doped zinc oxide. It is possible for the current conducting layer to be designed so that one of the layers of the Bragg mirror is formed by the current conducting layer and so that the current conducting layer has a reflective effect on account of its refractive index difference to a closest layer of the Bragg mirror.

According to at least one embodiment, a metal mirror is located on a side of the first Bragg mirror facing the carrier. The metal mirror is preferably located directly on the first Bragg mirror. The metal mirror is preferably made of a metal which reflects the laser radiation, for example, made of gold, for reflecting infrared radiation. The metal mirror is designed to reflect the laser radiation generated during operation of the semiconductor laser. Such a metal mirror has, for example, a reflectivity of at least 90% or 95% for the laser radiation generated. The reflectivity is increased by means of the first Bragg mirror, for example, to over 99%. Since the metal mirror already has a high reflectivity, a number of layer pairs of the first Bragg mirror can be reduced.

According to at least one embodiment, the metal mirror is in direct contact with the semiconductor layer sequence in places. In other words, the metal mirror can be used to electrically contact the semiconductor layer sequence.

According to at least one embodiment, viewed in a plan view of the semiconductor layer sequence, the metal mirror covers the first Bragg mirror and/or the semiconductor layer sequence. This means that the metal mirror is applied over the whole area on the first Bragg mirror and/or on the semiconductor layer sequence.

According to at least one embodiment, the first Bragg mirror comprises at least 8 or 10 or 12 or 14 layer pairs composed of two layers having a low and high refractive indices, respectively. Alternatively or additionally, the first Bragg mirror has at most 19 or 17 of such layer pairs. This comparatively small number of layer pairs is made possible by the combination with the metal mirror. Without the metal mirror, the first Bragg mirror would have to comprise at least 25 or 30 or 40 layer pairs, in the case of a semiconductor material as the base material for the first Bragg mirror.

According to at least one embodiment, the metal mirror is part of the bonding agent layer or the bonding agent layer is completely formed by the metal mirror. For example, the metal mirror is then a metallic solder or a planarized metal surface, which is soldered to the carrier or is fastened to the carrier by means of wafer bonding.

According to at least one embodiment, one or more electrically insulating passivation layer(s) is/are located in or on the metal mirror. For example, the metal mirror is divided by the passivation layer into a plurality of sub-regions, which are electrically independent from one another. In particular, it is possible for an electrical contact surface to be formed by the metal mirror for external electrical contacting of the semiconductor laser. In this case, the metal mirror can be composed of a plurality of partial layers, for example, a thin semiconductor contact layer having a thickness of at most 5 nm or 2 nm or 1 nm, and a mirror layer having a thickness of preferably at least 20 nm or 40 nm. The metal mirror can have a barrier layer on a side facing away from the semiconductor layer sequence, for instance of chromium, titanium and/or platinum.

According to at least one embodiment, the metal mirror is electrically insulated from the carrier. In this case, the semiconductor layer sequence is preferably also electrically insulated from the carrier.

According to at least one embodiment, all electrical contact surfaces for external electrical contacting of the semiconductor laser are located on a side of the bonding agent layer facing away from the carrier. In this case, the semiconductor laser is preferably designed to be mounted on an external mounting support, so that the carrier of the semiconductor laser is located between the external mounting carrier and the semiconductor layer sequence. Alternatively, it is possible for the electrical contact surfaces to be located on a side of the bonding agent layer facing away from the semiconductor layer sequence, or one of the contact layers is located on each side of the bonding agent layer.

According to at least one embodiment, the carrier is an electrically conductive carrier. In particular, the carrier is made of a semiconductor material such as silicon or germanium, which is different from a semiconductor material of the semiconductor layer sequence, or of a metal such as molybdenum.

According to at least one embodiment, the carrier is electrically insulating. For example, the carrier is made of a thermally conductive material such as a ceramic, for example, silicon nitride or aluminum nitride. Alternatively or additionally, the carrier can have or consist of glass.

According to at least one embodiment, the semiconductor layer sequence has a plurality of active zones. The active zones preferably follow one another along a growth direction of the semiconductor layer sequence, in particular in the direction perpendicular to the carrier main side. In a lateral direction within the semiconductor laser, parallel to the carrier main side, there is preferably no arrangement of a plurality of active zones next to one another. In other words, only one stacking of active zones is present per semiconductor laser.

According to at least one embodiment, the active zones are electrically connected in the direction perpendicular to the carrier main side via at least one tunnel diode. The tunnel diode preferably comprises two highly doped charge carrier regions with opposite charge carrier polarity. In particular, viewed along the growth direction, a tunnel diode is located between two adjacent active zones in each case.

For example, in the field of mobile telephones or other mobile devices, electric drivers having an output voltage of 5 V are widely used. In particular in the case of an infrared-emitting semiconductor laser, for example, emitting at a wavelength of maximum intensity of approximately 850 nm, two active zones arranged one above the other have a voltage drop of approximately 5 V. An efficient, cost-saving adaptation to conventional electric drivers is thus possible with active zones stacked one above the other. In addition, higher optical powers can be achieved with the same current intensity, in particular in pulsed operation. Furthermore, a lower laser threshold is obtained with the same current intensity. Thus, smaller operating currents can be used, which results in better high-frequency properties, in particular with regard to inductance.

According to at least one embodiment, the at least one tunnel diode extends only partly over the semiconductor layer sequence. By means of a locally delimited tunnel diode, it is possible for the tunnel diode to bring about a current limitation in the direction parallel to the carrier main side. In regions which lie next to the laterally structured tunnel diode, the semiconductor laser is operated in the reverse direction of a pn-junction, so that a current flow is not possible there as intended. In particular, the tunnel diode is mounted only within the resonator of the semiconductor laser, seen in a plan view.

The invention further relates to a laser arrangement. The laser arrangement comprises a plurality of semiconductor lasers, as indicated in connection with one or more of the above-mentioned embodiments. Features of the laser arrangement are therefore also disclosed for the semiconductor laser and vice versa.

In at least one embodiment, the semiconductor lasers of the laser arrangement are mounted on a common carrier. The semiconductor lasers are preferably present in a two-dimensional, in particular regular arrangement. The semiconductor lasers furthermore have the same main emission direction, which is preferably oriented in the direction perpendicular to the carrier main side.

According to at least one embodiment, the laser arrangement comprises semiconductor lasers having at least two different wavelengths of maximum intensity. In other words, one type of the semiconductor lasers emits at shorter wavelengths than another type of the semiconductor lasers. Preferably, exactly two, three, four, five or six different types of semiconductor lasers having different wavelengths of maximum intensity are present.

According to at least one embodiment, the semiconductor lasers can be energized independently of one another pairwise or at least the semiconductor lasers with different wavelengths of maximum intensity can be energized independently of one another. For example, each type of the semiconductor lasers is assigned to a particular electrical contact structure.

According to at least one embodiment, all semiconductor lasers of the laser arrangement are electrically connected in parallel. In this case, the semiconductor lasers of different types, if present, show differing temperature dependencies. In other words, a maximum amplification of the different types of semiconductor lasers is present at different temperatures. As a result, it is possible that depending on the temperature only the semiconductor lasers with the same wavelength of maximum intensity emit at the same time. In the event of a temperature change, a switchover preferably takes place automatically, in particular without an additional electronic control, to the semiconductor lasers more efficient at the other temperature.

According to at least one embodiment, the semiconductor lasers having the different wavelengths of maximum intensity have the same semiconductor layer sequence. The semiconductor layer sequence can extend contiguously and continuously over the semiconductor lasers, or the semiconductor lasers are formed by individual components, which can preferably be handled and/or mounted individually. In the case of components that can be handled separately, the semiconductor layer sequence of the semiconductor lasers is preferably constructed identically within the scope of the production tolerances, concerning layer sequence, layer thicknesses and layer compositions.

According to at least one embodiment, the semiconductor lasers have first and/or second Bragg mirrors, which differ from one another in their wavelengths of maximum intensity. Thus, the wavelength of maximum intensity is determined predominantly or exclusively by the first and/or second Bragg mirror(s) and only to a minor extent by the semiconductor layer sequence itself. In order to adapt a length of the resonator, a spacer layer made of a transparent material can be present.

The invention further relates to a method for producing a surface-emitting semiconductor laser. The method preferably produces a semiconductor laser as specified in connection with one or more of the above-mentioned embodiments. Features of the method are therefore also disclosed for the semiconductor laser and the laser arrangement, and vice versa.

In at least one embodiment, the method comprises at least the following steps, in particular in the order specified: providing a growth substrate, growing the semiconductor layer sequence on the growth substrate, attaching the carrier to the semiconductor layer sequence, and removing the growth substrate.

According to at least one embodiment, the semiconductor layer sequence is grown with a sacrificial layer and/or an etching stop layer. The sacrificial layer and/or the etching stop layer are used to remove the growth substrate in a targeted manner without impairing the semiconductor layer sequence. For example, the growth substrate is irradiated by a laser radiation when it is detached, said laser radiation being absorbed in the sacrificial layer, so that the sacrificial layer partially or completely decomposes. In the case of an etching stop layer, the growth substrate or a region between the growth substrate and the etching stop layer can be etched selectively with respect to the etching stop layer, so that the growth substrate can be removed from the semiconductor layer sequence by etching without destroying the semiconductor layer sequence. In particular, etching rates of the growth substrate and of the etching stop layer differ from one another by at least a factor of 10 or 100 or 1000.

According to at least one embodiment, the semiconductor layer sequence is grown continuously over all semiconductor lasers. Optionally, the semiconductor layer sequence is partially or completely removed in regions between adjacent semiconductor lasers after growth. Preferably, however, the semiconductor layer sequence is maintained as a continuous, contiguous layer sequence over all semiconductor lasers.

According to at least one embodiment, the first and/or the second Bragg mirror for the semiconductor lasers having the different wavelengths of maximum intensity are produced with different masks. The production is preferably a deposition method from the gas phase, for instance by chemical or physical vapor deposition, CVD or PVD for short. By means of a plurality of such masks, it is possible that the individual layers of the Bragg mirrors have different thicknesses and are thus optimized for different wavelengths.

BRIEF DESCRIPTION OF THE DRAWINGS

In the following a semiconductor laser described here, a laser arrangement described here and a method described here are explained in more detail with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the Figures.

DETAILED DESCRIPTION OF ILLUSTRATIVE EMBODIMENTS

Figure 1A:
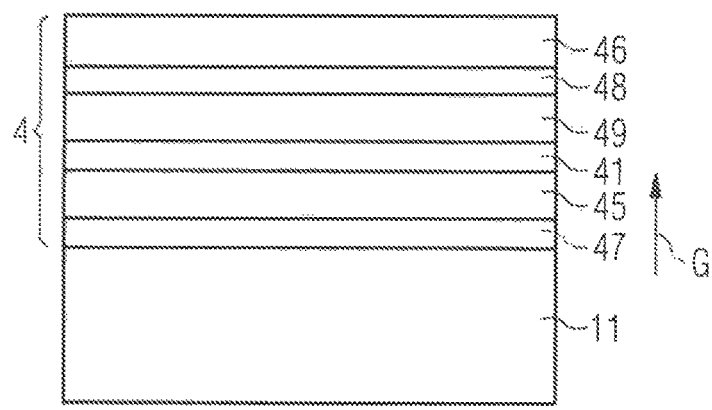
FIGS. 1A to 1H show schematic sectional representations of exemplary embodiments of methods described here for producing semiconductor lasers and laser arrangements described here.

FIG. 1 illustrates a production method for a semiconductor laser 1. According to FIG. 1A, a growth substrate 11, in particular a GaAs substrate, is provided. A semiconductor layer sequence 4, preferably made of the material system AlInGaAs, is epitaxially grown on the growth substrate 11. The growth takes place along a growth direction G.

At the growth substrate 11, the semiconductor layer sequence 4 comprises a sacrificial layer 47. The sacrificial layer 47 is followed by a current spreading layer 45. On the current spreading layer 45 an active zone 41 is located, which is preferably a multi-quantum well structure, MQW for short. A current narrowing layer 48 is located above a further semiconductor layer 49 but is not yet set up for current limitation in FIG. 1A. The semiconductor layer sequence 4 ends with a contact layer 46. The contact layer 46 is preferably p-doped. The current spreading layer 45 is preferably n-doped. Accordingly, an n-side of the semiconductor layer sequence 4 is located on the growth substrate 11. In a departure therefrom, however, the semiconductor layer sequence 4 can also start on the growth substrate 11 with a p-conducting side.

For example, the MQW of the active zone 41 is a sequence of quantum well layers of AlInGaAs or InGaAs and of barrier layers of AlGaAs, as can be the case for optional further active zones 42 not shown in FIG. 1. The current spreading layer 45 is made in particular of AlGaN, as well as the contact layer 46. The contact layer 46 preferably has a small thickness of at least 10 nm and/or of at most 20 nm. The sacrificial layer 47 is, in particular, an AlGaAs layer having a high Al content, which can preferably be etched, for example, with HF. The current narrowing layer 48 is made in particular of $Al_xGa_{1-x}As$, wherein preferably $x \geq 0.8$ or $x \geq 0.9$, so that electrically insulating aluminum oxide can be formed from the material of the current narrowing layer 48 by oxidation, see also FIG. 1G.

Figure 1B:
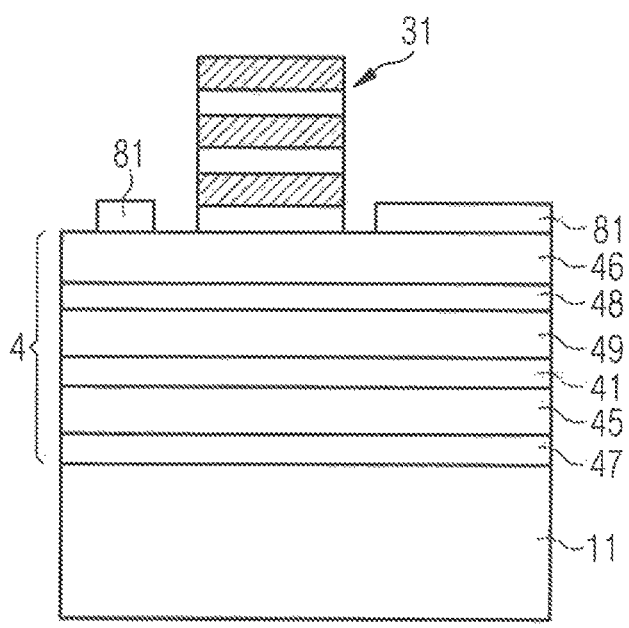

FIG. 1B shows that a first Bragg mirror 31 is applied to the contact layer 46 of the semiconductor layer sequence 4. For example, the first Bragg mirror 31 is a dielectric mirror having a layer sequence composed of layers having alternately high and low refractive indices. In contrast to mirrors made of semiconductor material, in which the layers have only comparatively small refractive index differences, a dielectric mirror having only comparatively few pairs of layers can be produced. Thus, in the case of a conventional mirror made of semiconductor materials, typically between 20 and 40 layer pairs are required. In contrast, the dielectric Bragg mirror 31 preferably has only between 3 and 5 layer pairs. A thickness of the first Bragg mirror 31 is preferably a few micrometers.

In addition, a first electrical contact surface 81 is applied to the contact layer 46. The contact surface 81 is formed by a metal layer or by a metallic layer sequence. Not apparent in the sectional view of FIG. 1B, the contact surface 81, viewed in a plan view, surrounds the first Bragg mirror 31 preferably all around, so that current can be impressed all around the first Bragg mirror 31 from the contact surface 81 into the contact layer 46.

Figure 1C:
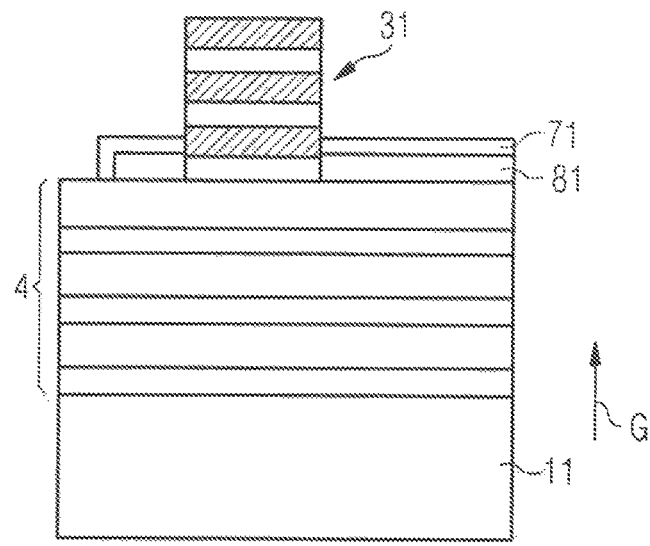

The first contact surface 81 can touch the first Bragg mirror 31 in a lateral direction, that is, in the direction perpendicular to the growth direction G, see also FIG. 1C. Furthermore, it can be seen in FIG. 1C that an electrically insulating passivation layer 71 is applied to the first contact surface 81.

An aperture in the contact surface 81, within which the first Bragg mirror 31 is located directly above the semiconductor layer sequence 4, preferably has a diameter of at least 5 µm or 10 µm and/or of at most 25 µm or 15 µm.

Figure 1D:
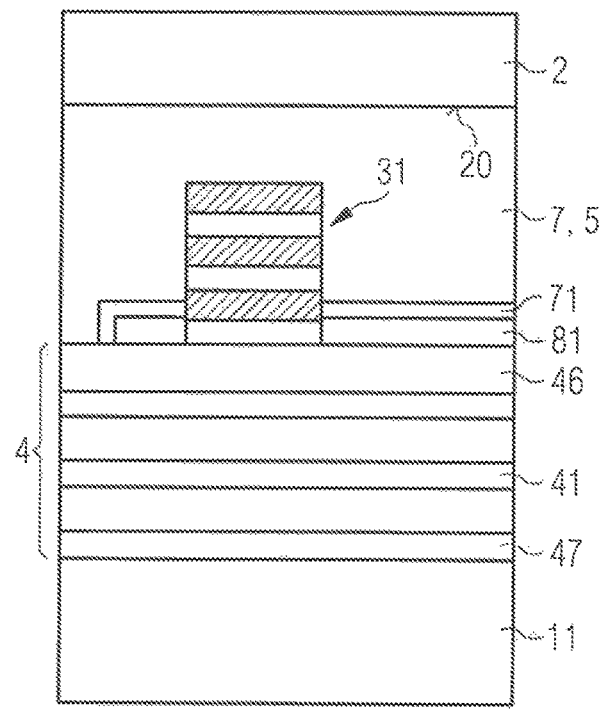

In FIG. 1D, it is illustrated that a metal mirror 7 is applied above the semiconductor layer sequence 4 and preferably in a form-fitting manner with respect to the passivation layer 71 and to the first Bragg mirror 31, for example, by vapor deposition. The metal mirror 7 consists, for example, of gold or a gold alloy. The metal mirror 7 is in direct contact with the semiconductor layer sequence 4, in particular with the contact layer 46.

On a side facing away from the growth substrate 11, the metal mirror 7 is preferably planarized. In this case, the metal mirror 7 projects beyond the first Bragg mirror 31, in particular by at least 200 nm or 500 nm or 1 µm. In other words, the metal mirror 7 is comparatively thick.

On a side facing away from the growth substrate 11, a carrier 2 is attached to the metal mirror 7, for example, by means of wafer bonding, the carrier main side 20 of which is designed to be flat. Thus, the metal mirror 7 simultaneously represents a bonding agent layer 5, via which the semiconductor layer sequence 4 is permanently connected to the carrier 2. The carrier 2 is, for example, a silicon carrier, an aluminum nitride carrier or a silicon nitride carrier.

Figure 1E:
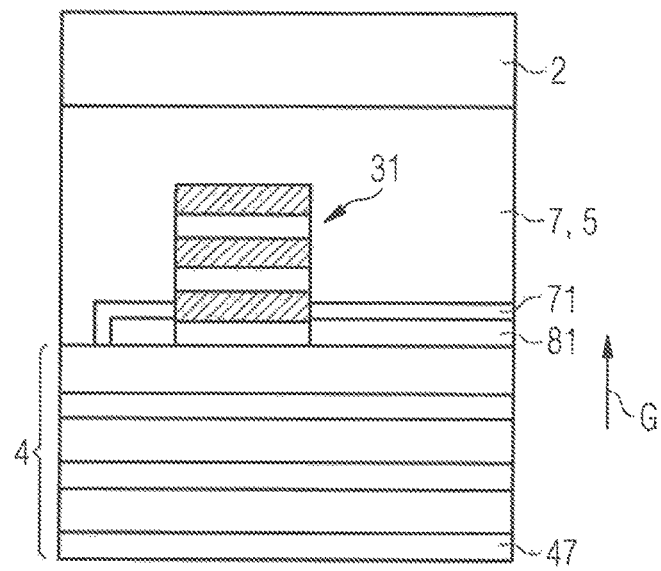

According to the method step of FIG. 1E, the growth substrate 11 is removed as far as the sacrificial layer 47, for instance by etching or by a laser lift-off method.

Figure 1F:
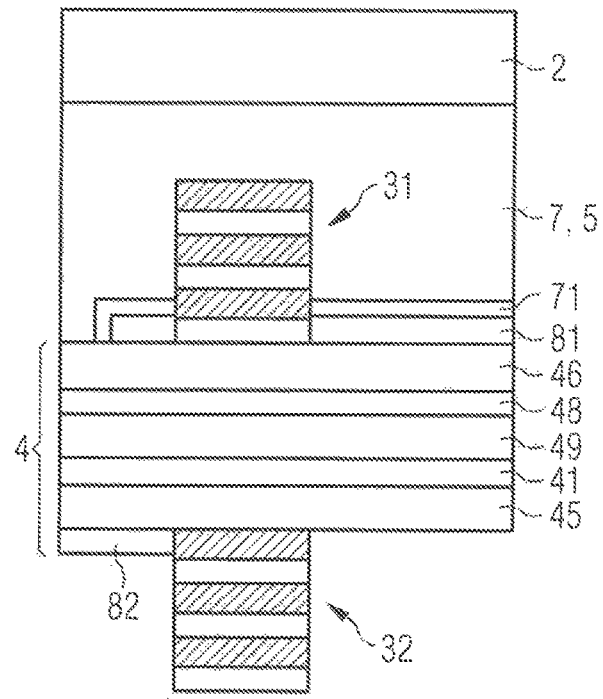

According to FIG. 1F, the sacrificial layer 47, which can alternatively also be an etching stop layer, is completely removed from the semiconductor layer sequence 4. This step is optional.

Furthermore, a second Bragg mirror 32 is produced on a side of the semiconductor layer sequence 4 facing away from the carrier 2, for example, by deposition from the gas phase. The second Bragg mirror 32 is again preferably a dielectric mirror. Furthermore, locally or even over the whole area, other than shown, a second electrical contact surface 82 is produced directly on the semiconductor layer sequence 4. Also the second contact surface 82 can be composed of one or more metal layers.

Figure 1G:
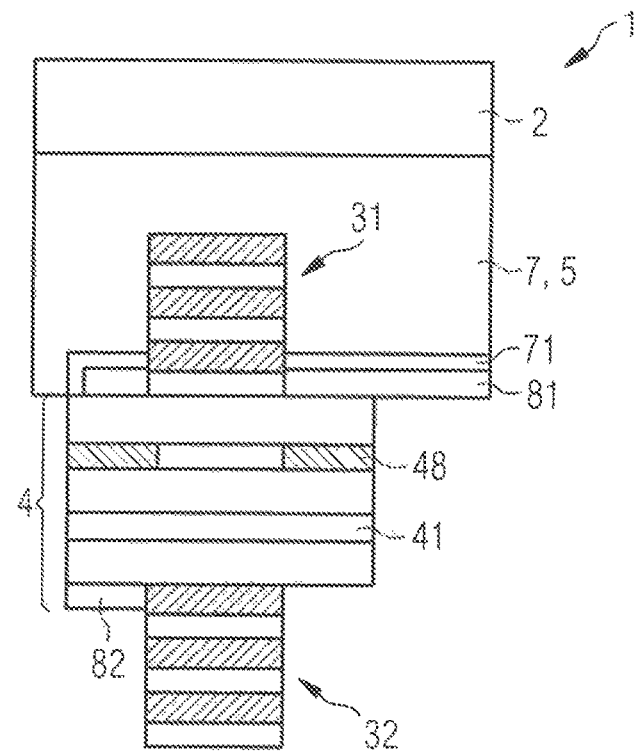

FIG. 1G shows that the semiconductor layer sequence 4 is laterally structured. As a result, the carrier 2, the metal mirror 7 and the first contact surface 81 are exposed in places. The semiconductor laser 1 can thus be electrically contacted externally via the contact surfaces 81, 82, which are located on a side of the metal mirror 7 facing away from the carrier 2.

The current narrowing layer 48 is also laterally oxidized after the structuring of the semiconductor layer sequence 4, so that the current narrowing layer 48 loses an electrical conductivity on the edges of the semiconductor layer sequence 4. A current limitation to the region between the two Bragg mirrors 31, 32 can thus be achieved.

Figure 1H:
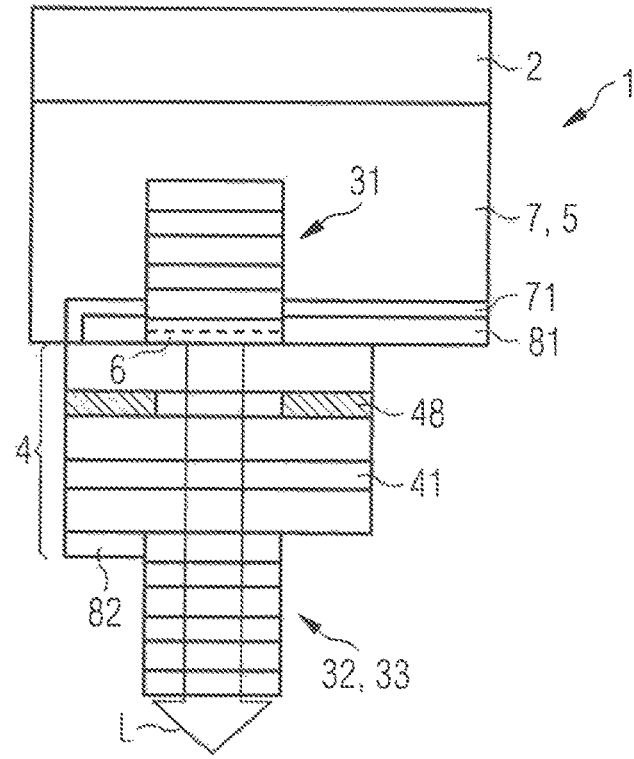

Finally, in FIG. 1H the semiconductor laser 1 is shown in operation. A resonator is formed by the two Bragg mirrors 31, 32 together with the metal mirror 7 and the semiconductor layer sequence 4 lying there between. The second Bragg mirror 32 also forms a light exit window 33 for a generated laser radiation L.

Figure 2:
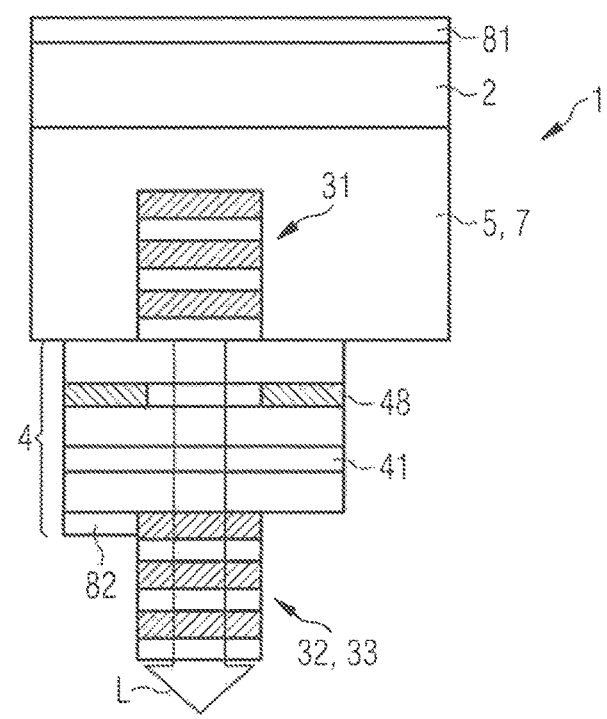
FIGS. 2 to 3 and 4A to 4B show schematic sectional representations of exemplary embodiments of semiconductor lasers described here.

In the exemplary embodiment of the semiconductor laser 1 according to FIG. 2, the carrier 2 is an electrically conductive carrier, for example, made of doped silicon. The first electrical contact surface 81 is located on a side of the carrier 2 facing away from the semiconductor layer sequence 4. Unlike shown in connection with FIG. 1, no passivation layer is present. Otherwise, the semiconductor laser 1 of FIG. 2 corresponds to that of FIG. 1.

Figure 3:
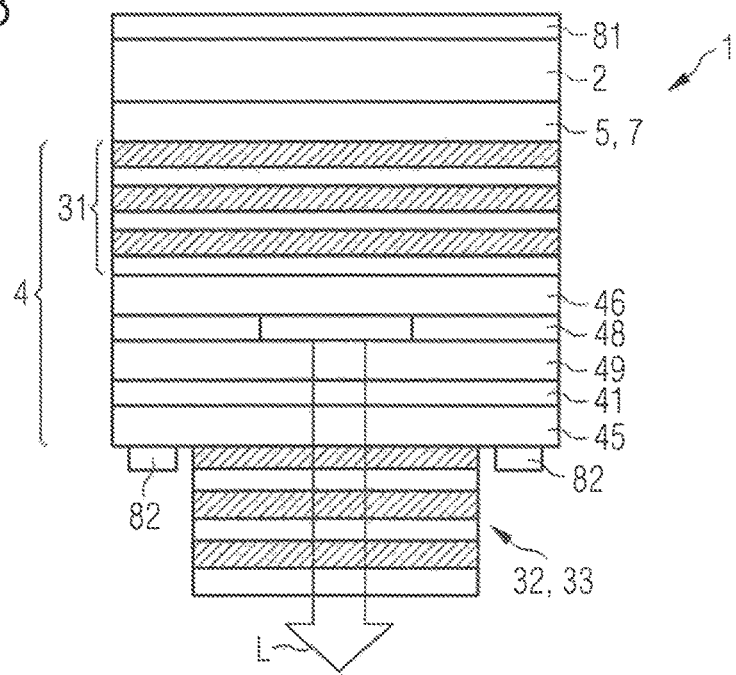

FIG. 3 illustrates a further exemplary embodiment of the semiconductor laser 1. In contrast to FIGS. 1 and 2, the first Bragg mirror 31 is a semiconductor mirror having alternating semiconductor layers having high and low refractive indices. As is also possible in all other exemplary embodiments, the first Bragg mirror 31 can extend continuously and over the whole area over the semiconductor layer sequence 4 and the carrier 2. The second Bragg mirror 32 can also be designed as a semiconductor mirror, but is preferably a dielectric mirror in order to reduce a number of required layer pairs.

Two dielectric mirrors, two semiconductor mirrors or a dielectric mirror and a semiconductor mirror can be arranged in all the exemplary embodiments as a combination option for the two Bragg mirrors 31, 32.

Figure 4A:
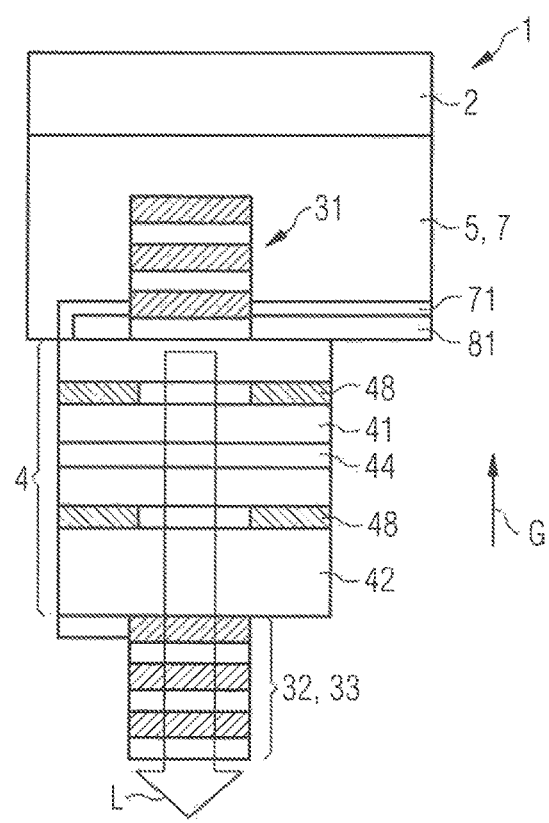

In the exemplary embodiment of FIG. 4A, the semiconductor layer sequence 4 comprises the active zone 41 and a further active zone 42. The active zones 41, 42 are electrically connected to one another via a tunnel diode 44 which is applied over the whole area. Such a semiconductor laser 1 can be operated with a higher operating voltage, for example, at approximately 5 V. The active zones 41, 42 are preferably positioned in such a way so that they are located at a maximum of an electric field during operation of the semiconductor laser 1. The tunnel diode 44 is accordingly preferably located in a minimum of the electric field. The tunnel diode 44 is made, for example, of AlGaInAsP and forms, in particular, a very highly doped pn-junction. The tunnel diode 44 is preferably doped in an amphoteric manner.

Figure 4B:
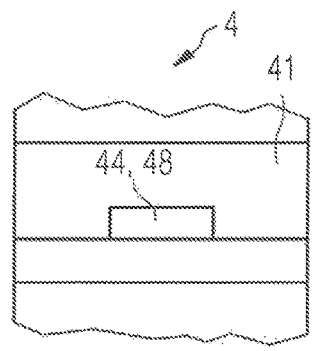

The current narrowing layers 48 of FIG. 4A can be replaced or supplemented by an only locally applied tunnel diode 44, see the section from the semiconductor layer sequence 4 in FIG. 4B. Only in the region in which the tunnel diode 44 is applied, a current conduction takes place in the direction parallel to the growth direction G of the semiconductor layer sequence 4. Thus, the locally applied tunnel diode 44 can simultaneously represent the current narrowing layer 48.

Alternatively, it is possible that an only locally applied tunnel diode 44 as well as one or more of the current narrowing layers 48 are present. Furthermore, deviating from the illustration in FIG. 4, more than two active zones 41, 42 can also be present. In this case, preferably at most 10 or at most 8 or 6 of the active zones 41, 42 are present.

Figure 5:
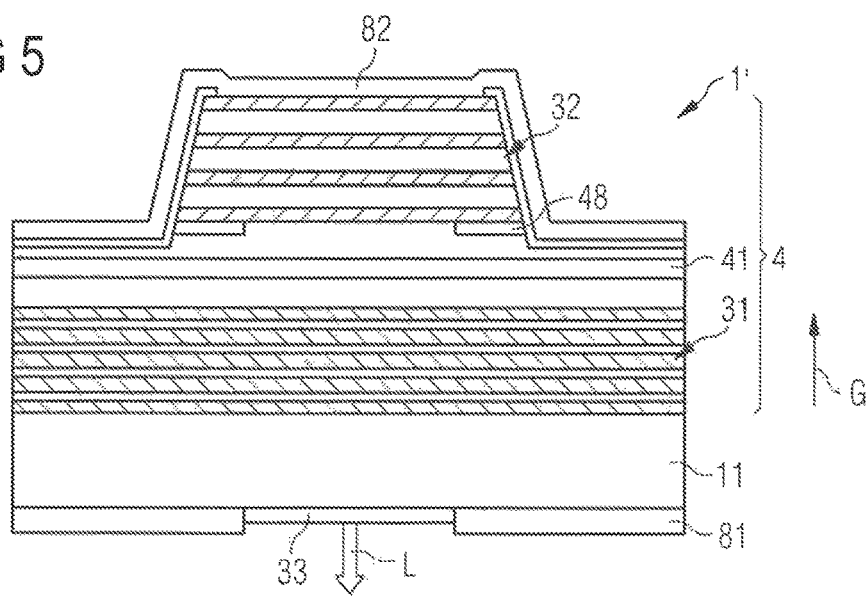
FIG. 5 shows a schematic sectional illustration of a modification of a semiconductor laser.

FIG. 5 illustrates a modification of a semiconductor laser 1'. In this case, the growth substrate 11 is still present in the finished semiconductor laser 1'. The laser radiation L is transmitted through the growth substrate 11 and through a separate light exit window 33, for example, an antireflection coating.

In the case of such a semiconductor laser 1', heat dissipation of the semiconductor layer sequence 4 is less efficient, since the growth substrate 11 makes it difficult to dissipate heat via the first contact surface 81. In addition, a metal mirror is absent, so that a comparatively large number of layer pairs, in particular in the first Bragg mirror 31, are necessary in order to achieve the required reflectivity. These problems are eliminated with the semiconductor laser 1 described in the exemplary embodiments.

Figure 6A:
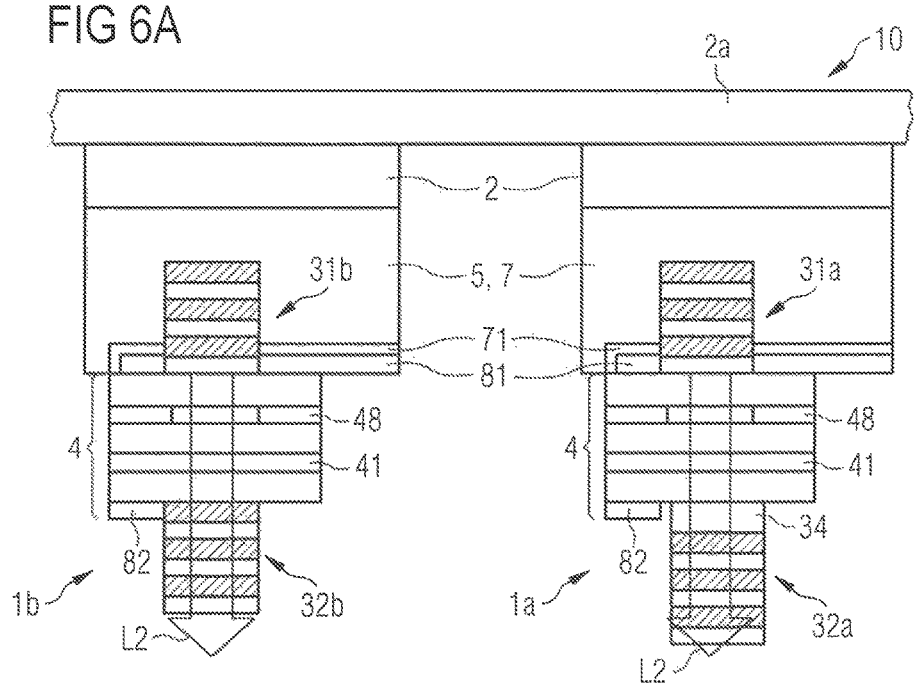
FIGS. 6A to 6D and 7 show schematic representations of laser arrangements and optoelectronic properties of such laser arrangements described here.
Figure 6B:
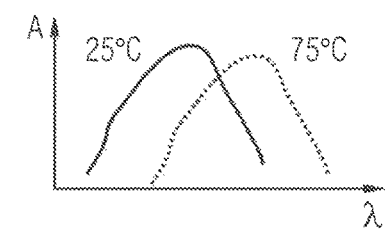
Figure 6C:
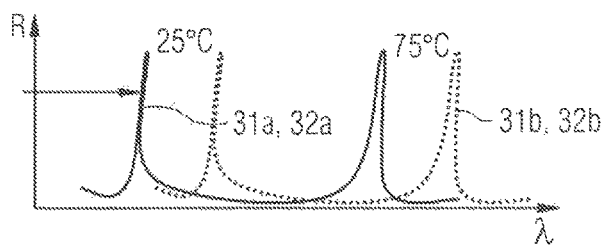
Figure 6D:
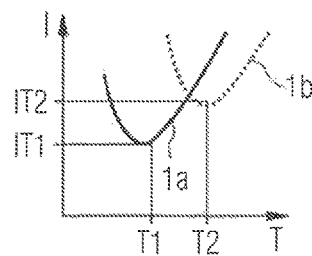
Figure 7:
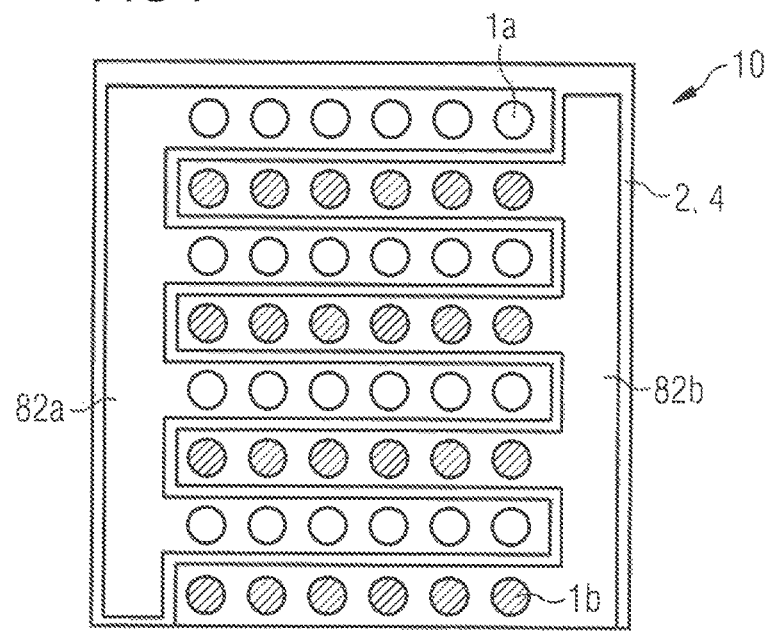

FIGS. 6 and 7 illustrate exemplary embodiments of laser arrangements 10. The laser arrangements 10 comprise a plurality of semiconductor lasers 1a, 1b. The semiconductor lasers 1a, 1b are mounted on a common carrier 2a. A grid dimension of a two-dimensional arrangement of the semiconductor lasers 1a, 1b on the common carrier 2a is preferably at least 30 µm or 40 µm and/or at most 100 µm or 60 µm.

The semiconductor lasers 1a, 1b according to FIG. 6A are constructed in particular as illustrated in conjunction with FIG. 1. Thus, there are individual semiconductor lasers 1a, 1b which can be handled separately. In contrast, the semiconductor lasers 1a, 1b of FIG. 7 are realized with a continuous semiconductor layer sequence 4 having a likewise continuous bonding agent layer 7, which forms the metal mirror 7. Both embodiments, that is separate semiconductor lasers 1a, 1b and semiconductor lasers 1a, 1b integrated in a common semiconductor layer sequence 4, can in each case be present in the exemplary embodiments.

The semiconductor laser 1a is optimized for a first emission wavelength and the semiconductor laser 1b for a second emission wavelength, so that laser radiations L1 and L2 can be emitted. For this purpose, the semiconductor lasers 1a, 1b preferably have the same semiconductor layer sequence 4. The semiconductor lasers 1a, 1b differ in their Bragg mirrors 31, 32. Furthermore, a spacer layer 34 is preferably present in at least one of the semiconductor lasers 1a. A length of the resonator of the semiconductor laser 1a is set via the spacer layer 34, so that the resonator length is optimized for an emission wavelength other than the semiconductor lasers 1b.

As a result, an operating temperature range of the laser arrangement 10 can be expanded. Depending on the temperature, either the semiconductor lasers 1a or the semiconductor lasers 1b emit. Which of the semiconductor lasers 1a, 1b emit can be automatically predetermined without additional regulation by the power data of the semiconductor lasers 1a, 1b. Such laser arrangements 10 can be used, for example, for distance sensors which operate with propagation time measurement, also referred to as TOF or time of flight.

The power parameters of the semiconductor lasers 1a, 1b are illustrated in conjunction with FIGS. 6B, 6C and 6D. FIG. 6B shows that a gain A, depending on the temperature, exhibits a different profile relative to the wavelength λ. For instance in the case of semiconductor lasers 1a, 1b, which are based on the material system AlInGaAs, a maximum of the gain A increases with approximately 0.3 nm/K. Thus, a significant shift of the maximum of the gain A takes place with increasing temperature towards larger wavelengths λ.

In contrast, the Bragg mirrors 31, 32 show a significantly different shift of the wavelength λ of maximum reflectivity R. In the case of Bragg mirrors 31, 32, for example, of $SiO_2$ and $TiO_2$, the shift is approximately 0.06 nm/K. Due to the different temperature responses of the gain A and the reflectivity R, only a restricted operating temperature range is possible in the case of only one type of semiconductor laser 1a, 1b. By using a plurality of semiconductor lasers 1a, 1b which are optimized for different wavelengths and thus operating temperatures, the operating temperature range of the laser arrangement 10 can be expanded. In this case, it is also possible to use more than two types of semiconductor lasers 1a, 1b.

In FIG. 6D, a laser threshold I of the semiconductor lasers 1a, 1b is represented as a function of the temperature T. The semiconductor laser 1a has the laser threshold IT1 at a temperature T1. This is lower than the laser threshold of the semiconductor laser 1b at the same temperature. If the temperature increases from T1 to T2, thus, the laser threshold IT2 of the semiconductor laser 1b is smaller than the laser threshold of the semiconductor laser 1a.

Above the relevant laser threshold, the associated semiconductor laser 1a, 1b has a lower electrical resistance. As a result of the temperature response illustrated in FIG. 6D, switching between the semiconductor lasers 1a, 1b takes place automatically without additional measures as a function of the temperature T, since essentially only the semiconductor laser 1a, 1b with the lower laser threshold I emits the laser radiation L1, L2.

It is thus possible for all semiconductor lasers 1a, 1b to be electrically connected in parallel. In contrast to this, see FIG. 7, separate contact surfaces 82a, 82b can also be used for the respective type of semiconductor lasers 1a, 1b. Furthermore, it is possible for the semiconductor lasers 1a, 1b or groups of semiconductor lasers 1a, 1b to be controlled electrically independently of one another, in contrast to the illustration.

Figure 8A:
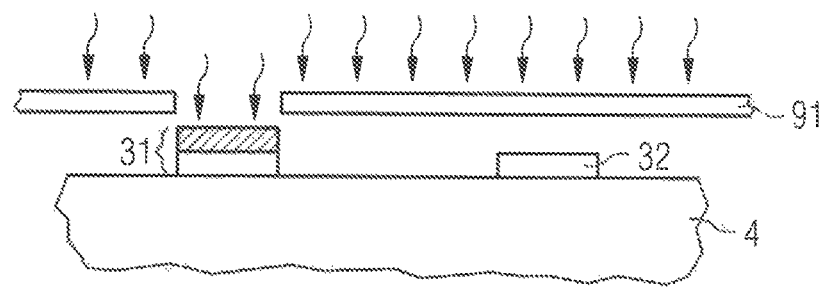
FIGS. 8A to 8B show schematic sectional representations of exemplary embodiments of methods described here for producing semiconductor lasers and laser arrangements described here.
Figure 8B:
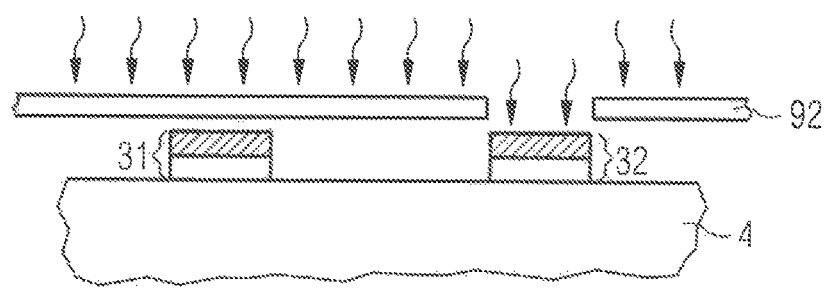

FIG. 8 illustrates that, in a production method of the semiconductor laser 1, the Bragg mirrors 31, 32 for the semiconductor lasers 1a, 1b, for example, as shown in FIG. 7, are grown with different masks 91, 92. Thus, on the same semiconductor layer sequence 4 the Bragg mirrors 31, 32 can be applied with individually different, varying thicknesses, so that the Bragg mirrors 31, 32 can be efficiently optimized for different wavelengths.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. The relative thickness ratios, length ratios and positions of the drawn components relative to one another are correctly reproduced in the figures if not indicated otherwise.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:
1. A surface-emitting semiconductor laser comprising:
a carrier having a carrier main side mechanically carrying a semiconductor laser;
a first Bragg mirror and a second Bragg mirror so that the second Bragg mirror is further away from the carrier than the first Bragg mirror;
a semiconductor layer sequence located between the first and the second Bragg mirrors having at least one active zone for generating laser radiation;

a metal mirror arranged directly on a side of the first Bragg mirror facing the carrier for reflecting laser radiation generated during operation of the semiconductor laser;

a bonding agent layer located between the carrier and the semiconductor layer sequence, wherein the bonding agent layer is of a different material system than the carrier and the semiconductor layer sequence, and wherein the carrier is different from a growth substrate of the semiconductor layer sequence and no growth substrate is present;

a resonator oriented perpendicular to the carrier main side; and an electrically insulating passivation layer located in the metal mirror so that an electrical contact surface for external electrical contacting of the semiconductor laser is formed by the metal mirror and is electrically insulated from the carrier.

2. The semiconductor laser according to claim 1, wherein at least one of the first Bragg mirror or the second Bragg mirror is electrically insulating and is formed as a dielectric layer sequence.

3. The semiconductor laser according to claim 2,
wherein the first Bragg mirror and the second Bragg mirror are electrically insulating and are formed in each case as a dielectric layer sequence, and
wherein the second Bragg mirror forms a light exit window of the semiconductor laser.

4. The semiconductor laser according to claim 1, wherein at least one of the first Bragg mirror or the second Bragg mirror is an epitaxially grown mirror, which is made of doped or undoped semiconductor materials and which is electrically conductive.

5. The semiconductor laser according to claim 1, further comprising a current conducting layer, wherein the current conducting layer is located between at least one of the first Bragg mirror or the second Bragg mirror and the semiconductor layer sequence, and wherein the current conducting layer comprises a transparent conductive oxide for current conduction in a direction parallel to the carrier main side.

6. The semiconductor laser according to claim 1, wherein the metal mirror comprises:
a plurality of partial layers;
a semiconductor contact layer having a thickness of at most 2 nm; and
a mirror layer made of gold having a thickness of at least 40 nm.

7. The semiconductor laser according to claim 1, wherein the metal mirror is in direct contact with the semiconductor layer sequence in places and completely covers the first Bragg mirror, viewed in plan view.

8. The semiconductor laser according to claim 1,
wherein the first Bragg mirror comprises at least 10 and at most 19 layer pairs of layers with alternately low and high refractive indices, and
wherein the metal mirror forms the bonding agent layer.

9. The semiconductor laser according to claim 1, wherein the passivation layer is made of an oxide or a nitride and has a thickness of between 10 nm and 200 nm inclusive.

10. The semiconductor laser according to claim 1, wherein all the electrical contact surfaces for external electrical contacting of the semiconductor laser are located on a side of the bonding agent layer facing away from the carrier.

11. The semiconductor laser according to claim 1, wherein the carrier is electrically insulating and comprises at least one ceramic and/or at least one glass.

12. The semiconductor laser according to claim 1, wherein the semiconductor layer sequence comprises a plurality of active zones, and wherein the active zones are electrically connected in a direction perpendicular to the carrier main side via at least one tunnel diode.

13. The semiconductor laser according to claim 12, wherein the tunnel diode extends partially over the semiconductor layer sequence so that a current narrowing in a direction parallel to the carrier main side is achieved by the tunnel diode.

14. A laser arrangement comprising:
a plurality of semiconductor lasers according to claim 1,
wherein all the semiconductor lasers are mounted on the carrier in a two-dimensional arrangement, and
wherein all the semiconductor lasers have the same main emission direction in a direction perpendicular to the carrier main side.

15. The laser arrangement according to claim 14,
wherein the semiconductor lasers comprise at least two different wavelengths of maximum intensity, and
wherein the semiconductor lasers are electrically connected in parallel, but depending on a temperature, only the semiconductor lasers of the same wavelength of maximum intensity emit the laser radiation at the same time.

16. The laser arrangement according to claim 15, wherein the semiconductor lasers having the different wavelengths of maximum intensity extend over the same semiconductor layer sequence but comprise different first and/or second Bragg mirrors so that the wavelengths of maximum intensity are predetermined by the first and/or second Bragg mirrors.

17. A method for producing the semiconductor laser according to claim 1, the method comprising:
growing the semiconductor layer sequence on a growth substrate;
attaching the carrier to the semiconductor layer sequence; and
removing the growth substrate.

18. The method according to claim 17,
wherein the semiconductor layer sequence is grown with a sacrificial layer, and
wherein the sacrificial layer is partially or completely destroyed during a removal of the growth substrate.

19. The method according to claim 17,
wherein the semiconductor layer sequence is grown continuously over all semiconductor lasers, and
wherein the first and/or second Bragg mirrors for the semiconductor lasers with different wavelengths of maximum intensity are produced with different masks.

* * * * *